(12) United States Patent
Wu et al.

(10) Patent No.: US 12,062,619 B2
(45) Date of Patent: Aug. 13, 2024

(54) SEMICONDUCTOR PACKAGES AND FORMING METHODS THEREOF

(71) Applicant: Taiwan Semiconductor Manufacturing Company, Ltd., Hsinchu (TW)

(72) Inventors: Kai-Chiang Wu, Hsinchu (TW); Chin-Liang Chen, Kaohsiung (TW); Jiun-Yi Wu, Taoyuan (TW); Yen-Ping Wang, Changhua County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 92 days.

(21) Appl. No.: 17/736,945

(22) Filed: May 4, 2022

(65) Prior Publication Data

US 2022/0262734 A1   Aug. 18, 2022

Related U.S. Application Data

(63) Continuation of application No. 16/924,130, filed on Jul. 8, 2020, now Pat. No. 11,348,874.

(51) Int. Cl.
*H01L 23/538* (2006.01)
*H01L 23/31* (2006.01)
*H01L 25/00* (2006.01)
*H01L 25/065* (2023.01)

(52) U.S. Cl.
CPC ...... *H01L 23/5385* (2013.01); *H01L 23/3128* (2013.01); *H01L 23/5383* (2013.01); *H01L 23/5389* (2013.01); *H01L 25/0657* (2013.01); *H01L 25/50* (2013.01)

(58) Field of Classification Search
CPC ............. H01L 23/3128; H01L 23/5389; H01L 23/5385; H01L 25/50
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |

(Continued)

*Primary Examiner* — Jaehwan Oh
*Assistant Examiner* — John M Parker
(74) *Attorney, Agent, or Firm* — JCIPRNET

(57) ABSTRACT

A semiconductor package includes a redistribution layer structure, a first semiconductor chip, a circuit board structure and an encapsulation layer. The redistribution layer structure has a first side and a second side opposite to the first side. The first semiconductor chip is electrically connected to the first side of the redistribution layer structure. The circuit board structure is electrically connected to the first side of the redistribution layer structure, and the circuit board structure includes a first mask layer having an opening pattern that corresponds to first semiconductor chip. The encapsulation layer laterally encapsulates the circuit board structure and fills in a space between the semiconductor chip and the opening pattern of the first mask layer of the circuit board structure.

20 Claims, 13 Drawing Sheets

(56) References Cited

U.S. PATENT DOCUMENTS

| | | |
|---|---|---|
| 9,666,502 B2 | 5/2017 | Chen et al. |
| 9,735,131 B2 | 8/2017 | Su et al. |
| 2017/0345761 A1* | 11/2017 | Yu .................. H01L 21/565 |
| 2020/0211956 A1* | 7/2020 | Wu .................. H01L 24/73 |

* cited by examiner

100:102,104,106

100: 102,104,106
CBS: CL,BL1,BL2,ML1,ML2,212

SEMICONDUCTOR PACKAGES AND FORMING METHODS THEREOF

CROSS-REFERENCE TO RELATED APPLICATION

This application is a continuation application of and claims the priority benefit of a prior application Ser. No. 16/924,130, filed on Jul. 8, 2020. The entirety of each of the above-mentioned patent applications is hereby incorporated by reference herein and made a part of this specification.

BACKGROUND

Semiconductor packages are used in a variety of electronic applications, such as personal computers, cell phones, digital cameras, and other electronic equipment. In terms of the packaging used for integrated circuit components or semiconductor dies, one or more chip packages are generally bonded to a circuit carrier (e.g., a system board, a printed circuit board, or the like) for electrical connections to other external devices or electronic components. Although the existing semiconductor package has been generally adequate for their intended purposes, it has not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
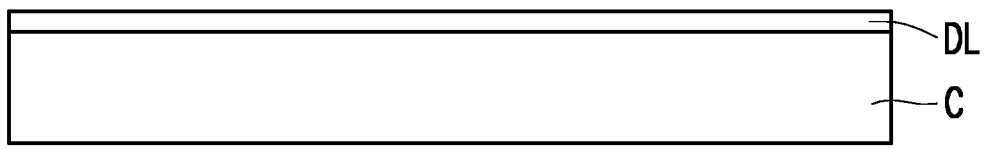
FIG. 1A to FIG. 1G are schematic cross-sectional views of a method of forming a semiconductor package in accordance with some embodiments.

The following disclosure provides many different embodiments, or examples, for implementing different features of the provided subject matter. Specific examples of components and arrangements are described below for the purposes of conveying the present disclosure in a simplified manner. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the same reference numerals and/or letters may be used to refer to the same or similar parts in the various examples the present disclosure. The repeated use of the reference numerals is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein to facilitate the description of one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1G are schematic cross-sectional views of a method of forming a semiconductor package in accordance with some embodiments. It is understood that the disclosure is not limited by the method described below. Additional operations can be provided before, during, and/or after the method and some of the operations described below can be replaced or eliminated, for additional embodiments of the methods.

Referring to FIG. 1A, a carrier C is provided with a dielectric layer DL thereon. In some embodiments, the carrier C is a non-semiconductor material, such as a glass carrier, a ceramic carrier, or the like. In some embodiments, the dielectric layer DL includes silicon oxide, or TEOS, while other dielectric materials such as silicon carbide, silicon oxynitride, silicon oxy-carbo-nitride, PSG, BSG, BPSG, or the like may also be used. The dielectric layer DL may be formed by a deposition process, a spin-on coating process, or the like. In other embodiments, the dielectric layer DL includes a molding compound, a molding underfill, a resin such as epoxy, or the like, and may be formed by a molding process. In other embodiments, the dielectric layer DL includes a polymer material, such as polybenzoxazole (PBO), polyimide (PI), benzocyclobutene (BCB), or the like, and may be formed by a deposition process, a lamination process, a spin-on coating process, or the like. In some embodiments, a debonding layer (not shown) is formed between the carrier C and the dielectric layer DL. In some embodiments, the debonding layer includes an Ultra-Violet (UV) glue, a Light-to-Heat Conversion (LTHC) glue, or the like, although other types of adhesives may be used. The debonding layer is decomposable under the heat of light to thereby release the carrier C from the structure formed thereon.

Figure 1B:
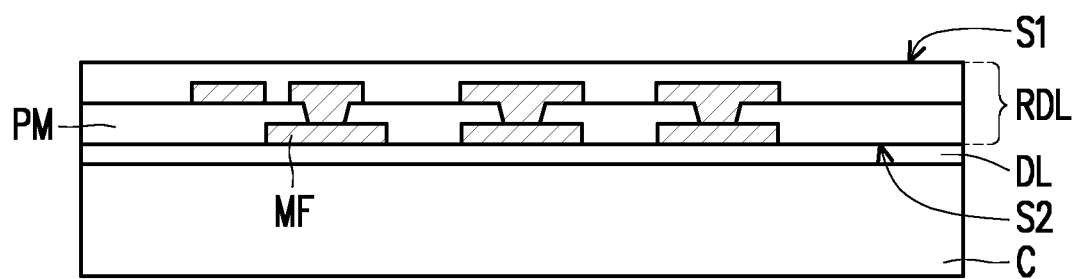

Referring to FIG. 1B, a redistribution layer structure RDL is formed on the carrier C. In some embodiments, the redistribution layer structure RDL includes metal features MF and polymer layers PM. The metal features MF are disposed in the polymer layers PM and electrically connected to each other. Portions of the metal features MF are covered by the uppermost polymer layer PM. In some embodiments, each polymer layer PM includes polybenzoxazole (PBO), polyimide (PI), benzocyclobutene (BCB), the like, or a combination thereof. The polymer layers PM may be replaced by dielectric layers or insulating layers as needed. In some embodiments, the metal features MF include metal vias and metal lines. The metal vias may be formed between and in contact with two metal lines. Each metal feature MF may include tungsten (W), copper (Cu), a copper alloy, aluminum (Al), an aluminum alloy or a combination thereof. In some embodiments, a barrier layer (not shown) is formed between each metal feature MF and the adjacent polymer layer PM to prevent the material of the metal feature MF from migrating to the neighboring device. The barrier layer may include Ta, TaN, Ti, TiN, CoW or a combination thereof. In some embodiments, a seed layer (not shown) is further formed between each metal feature MF and the barrier layer. The seed layer may include Cu, Ag or the like. In some embodiments, the redistribution layer structure RDL further includes an etching stop layer (not shown) between two adjacent metal features and/or two adjacent polymer layers. The etching stop layer may include SiN, SiC, SiCN, AlN, $Al_2O_3$ or a combination thereof. In some embodiments, the redistribution layer structure RDL is formed by multiple electroplating processes, multiple damascene processes, or the like. In some embodiments, the redistribution layer structure RDL has a first side S1 (e.g., front side) and a second side S2 (e.g., backside) opposite to the first side S1.

Figure 1C:
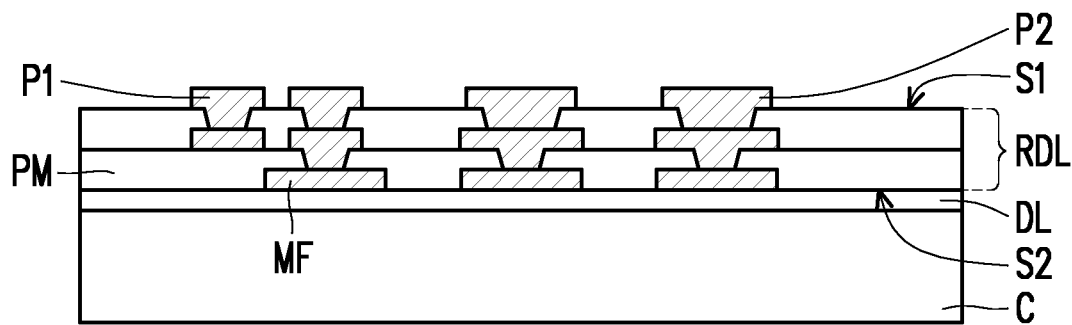

Referring to FIG. 1C, a plurality of metal pads P1 and a plurality of metal pads P2 are formed on the first side S1 of the redistribution layer structure RDL. The metal pads P1 and P2 penetrate through the uppermost polymer layer PM and are electrically connected to the redistribution layer structure RDL. In some embodiments, the metal pads P2 are formed aside the metal pads P1 from a top view. The metal pads P2 partially or fully surround the metal pads P1. The metal pads P1 and P2 are configured for ball mount. In some embodiments, the dimension (e.g., width) of the metal pads P1 is different from the dimension (e.g., width) of the metal pads P2. For example, the dimension (e.g., width) of the metal pads P1 is smaller than the dimension (e.g., width) of the metal pads P2. The metal pads P1 and P2 are referred to as under-ball metallurgy (UBM) pads in some examples. The metal pads P1 and P2 may include tungsten (W), copper (Cu), a copper alloy, aluminum (Al), an aluminum alloy or a combination thereof. In some embodiments, a barrier layer (not shown) is formed between each metal pad and the uppermost polymer layer PM. The barrier layer may include Ta, TaN, Ti, TiN, CoW or a combination thereof. In some embodiments, a seed layer (not shown) is further formed between each metal pad and the barrier layer. In some embodiments, the metal pads P1 and P2 are formed by an electroplating process, a damascene process, or the like. In some embodiments, the metal pads P1 and P2 are regarded as part of the redistribution layer structure RDL.

Figure 1D:
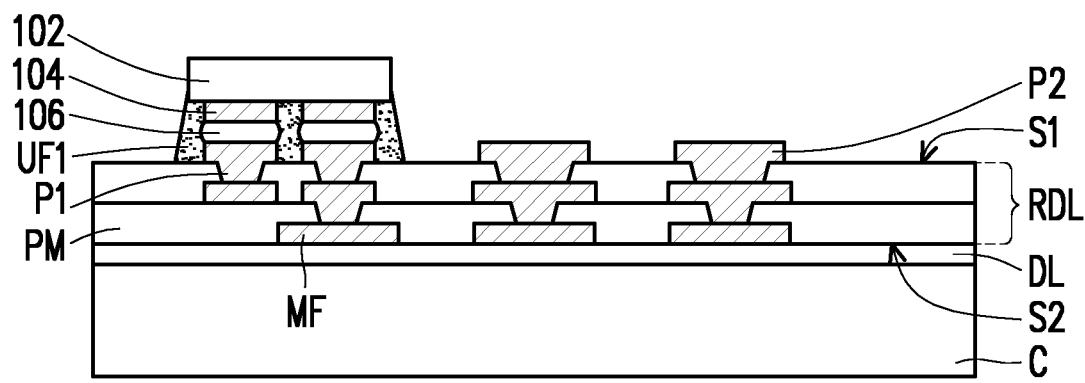

Referring to FIG. 1D, a first semiconductor chip 100 is placed on (e.g., flip-chip mounted on) the first side S1 of the redistribution layer structure RDL. In some embodiments, the first semiconductor chip 100 includes an integrated passive device. In some embodiments, the first semiconductor chip 100 has a semiconductor substrate 102, connection pads 104, and bumps 106. The semiconductor substrate 102 includes an elementary semiconductor such as silicon, germanium and/or a compound semiconductor such as silicon germanium, silicon carbide, gallium arsenic, indium arsenide, gallium nitride or indium phosphide. In some embodiments, an integrated passive device is disposed on and/or in the semiconductor substrate 102. In some embodiments, the integrated passive device includes a resistor, a capacitor, an inductor, a resonator, a filter, and/or the like. The first semiconductor chip 100 is referred to as a transistor-free chip in some examples. In other embodiments, a transistor may be required to enable the integrated passive device variable and adjustable.

The connection pads 104 are formed over the semiconductor substrate 102 and electrically connected to the integrated passive device of the first semiconductor chip 100. In some embodiments, the connection pads 104 include copper-containing pillars, and are formed by an electroplating process. In some embodiments, the connection pads 104 are formed as the top portions of the first semiconductor chip 100. The bumps 106 are formed on the connection pads 104. In some embodiments, the bumps 106 include solder bumps, and are formed with a ball drop process or an electroplating process. The bumps 106 are referred to as micro-bumps in some examples. The connection pads 104 and/or the bumps 106 constitute parts of the connectors (e.g., front-side connectors) of the first semiconductor chip 100. In some embodiments, the first semiconductor chip 100 is bonded to the metal pads P1 through the bumps 106. In some embodiments, the first semiconductor chip 100 having the bumps 106 is bonded to the metal pads P1 with the front side thereof facing the redistribution layer structure RDL.

Thereafter, an underfill layer UF1 is formed to fill the space between the redistribution layer structure RDL and the first semiconductor chip 100. In some embodiments, the underfill layer UF1 is formed to surround the metal pads P1, the connection pads 104 and the bumps 106. In some embodiments, the underfill layer UF1 includes a molding compound such as epoxy, and is formed using a dispensing process, an injecting process, and/or a spraying process.

Figure 1E:
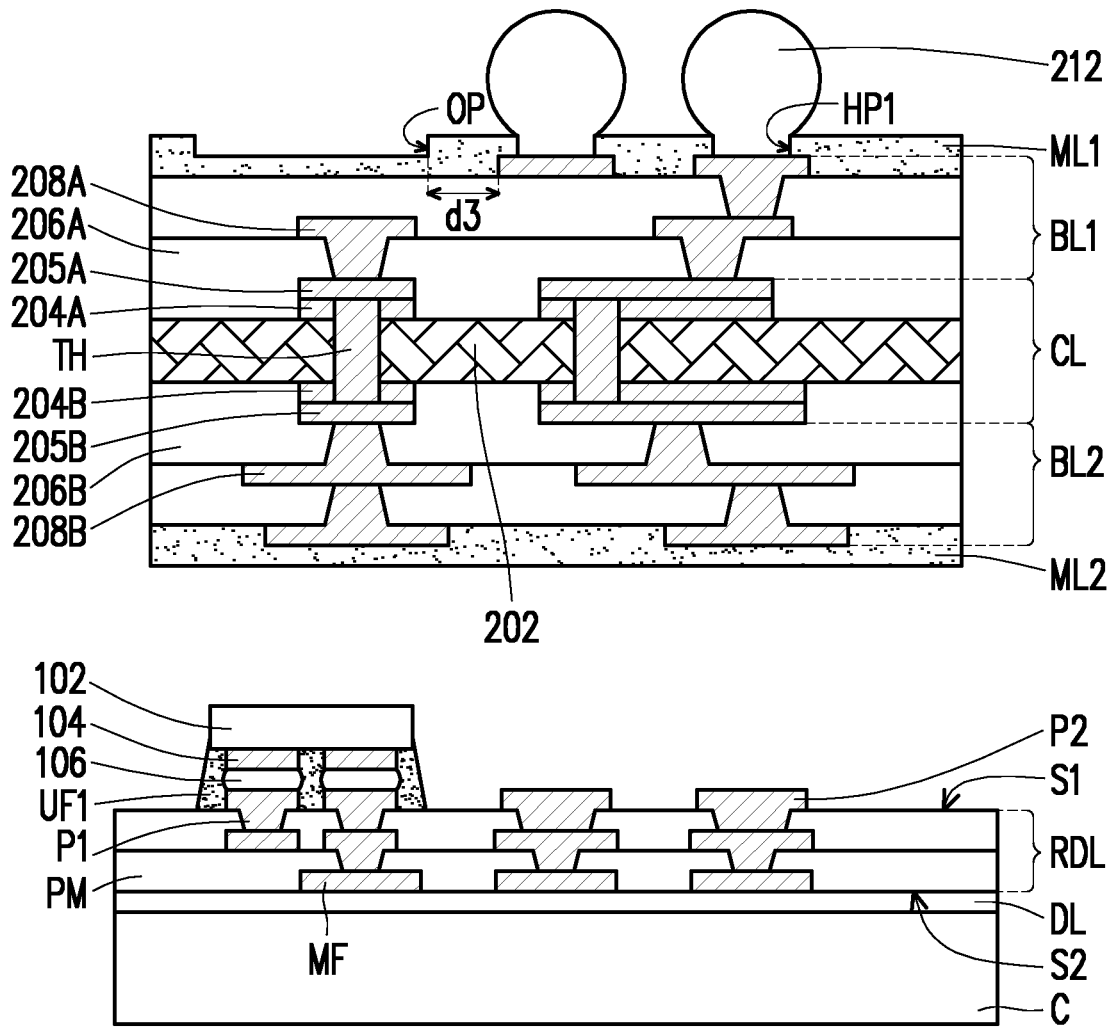

Referring to FIG. 1E, a circuit board structure CBS is provided. In some embodiments, the circuit board structure CBS includes a core layer CL and first and second build-up layers BL1, BL2 respectively located on two surfaces of the core layer CL.

In some embodiments, the core layer CL includes a core dielectric layer 202, core conductive layers 204A and 204B, conductive lids 205A and 205B, and plated through holes TH. In some embodiments, the core dielectric layer 202 includes prepreg (which contains epoxy, resin, silica filler and/or glass fiber), Ajinomoto Buildup Film (ABF), resin coated copper foil (RCC), polyimide, photo image dielectric (PID), ceramic core, glass core, molding compound, a combination thereof, or the like. The core dielectric layer 202 may be formed by a lamination process, a coating process, or the like. The core conductive layers 204A and 204B are formed on the opposite sides of the core dielectric layer 202. In some embodiments, the core conductive layers 204A and 204B include copper, gold, tungsten, aluminum, silver, gold, a combination thereof, or the like. The conductive lids 205A and 205B are located respectively over the core conductive layers 204A and 204B. In some embodiments, the conductive lids 205A and 205B include copper or other suitable conductive material. In some embodiments, the plated through holes TH are disposed in and penetrate through the core dielectric layer 202, which provide electrical connection between the core conductive layer 204A and the core conductive layer 204B. In other words, the plated through holes TH provide electrical paths between the electrical circuits located on two opposite sides of the core dielectric layer 202. In some embodiments, the plated through holes TH may be filled with a conductive material such as copper. In other embodiments, the plated through holes TH may be lined with a conductive material and filled up with an insulating material.

In some embodiments, the first and second build-up layers BL1 and BL2 are respectively disposed on the opposite sides of the core layer CL. Specifically, the first build-up layer BL1 is formed over the conductive lid 205A of the core layer CL, and the second build-up layer BL2 is formed over the conductive lid 205B of the core layer CL. In some embodiments, the formation of the first build-up layer BL1 may include forming first dielectric layers 206A and first conductive patterns 208A alternately stacked over the first surface of the core layer CL. Similarly, the formation of the second build-up layer BL2 may include forming second dielectric layers 206B and second conductive patterns 208B alternately stacked over the second surface of the core layer CL. Although only two layers of conductive patterns and two layers of dielectric layers are illustrated for each of the first and second build-up layers BL1 and BL2, the scope of the disclosure is not limited thereto.

In some embodiments, the first and second dielectric layers 206A and 206B include prepreg (which contains epoxy, resin, and/or glass fiber), polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), the like, or a combination thereof. In some embodiments, the core dielectric layer 202 and the first and second dielectric layers 206A, 206B may be made by the same material. In some embodiments, the first and second dielectric layers 206A and 206B may be patterned using a photolithography and etching process. In some embodiments, the first and second dielectric layers 206A and 206B may be patterned by a film lamination followed by a laser drilling process. In some embodiments, the first and second conductive patterns 208A and 208B include metal, such as aluminum, titanium, copper, nickel, tungsten, and/or alloys thereof. In some embodiments, the first and second conductive patterns 208A and 208B may be formed by a deposition followed by a photolithography and etching process. In some embodiments, the first and second conductive patterns 208A and 208B may be formed by an electroplating or an electroless plating. In some embodiments, the number of layers in the first build-up layer BL1 is equal to the number of layers in the second build-up layer BL2. In other embodiments, the number of layers in the first build-up layer BL1 is different from the number of layers in the second build-up layer BL2.

Continue referring to FIG. 1E, a first mask layer ML1 is formed over the first build-up layer BL1, and a second mask layer ML2 is formed over the second build-up layer BL2. In some embodiments, the first and second mask layers ML1 and ML2 may be formed of a material having a chemical composition of silica, barium sulfate and epoxy resin, and/or the like. The first and second mask layers ML1 and ML2 are referred to as solder masks (SM) in some examples. The first and second mask layers ML1 and ML2 are configured to prevent short, corrosion or contamination of the circuit pattern and protect the circuit of the printed circuit board from external impacts and chemicals.

In some embodiments, the first mask layer ML1 includes first hole patterns HP1 that correspond to the positions of subsequently formed bumps 212 and an opening pattern OP that corresponds to the position of the underlying first semiconductor chip 100, as shown in the top view of FIG. 3. In the disclosure, the opening pattern OP of the first mask layer ML1 is configured to improve the molding performance, which will be described in details below. In some embodiments, the first hole patterns HP1 of the first mask layer ML1 expose the outermost first conductive patterns 208A while the opening pattern OP of the first mask layer ML1 does not expose any of the outermost first conductive patterns 208A. In some embodiments, the opening pattern OP does not penetrate through the first mask layer ML1, as shown in FIG. 1E. Specifically, the opening pattern OP of the first mask layer ML1 covers the outermost first dielectric layer 206A. In some embodiments, the opening pattern OP of the first mask layer ML1 is defined by a half-tone mask or a gray-tone reticle.

In some embodiments, the second mask layer ML2 covers the outermost second dielectric layer 206B of the second build-up layer BL2. Specifically, the second mask layer ML2 has a substantially planar surface at this stage.

Thereafter, first bumps 212 are formed in the first hole patterns HP1 of the first mask layer ML1 over the first build-up layer BL1. In some embodiments, the first bumps 212 may be solder bumps, and/or may include metal pillars (e.g., copper pillars), solder caps formed on metal pillars, and/or the like. When solder is used, the solder may include either eutectic solder or non-eutectic solder. The solder may include lead or be lead-free, and may include Sn—Ag, Sn—Cu, Sn—Ag—Cu, or the like. The first bumps 212 may be formed by a suitable process such as an evaporation, an electroplating, a ball drop, or a screen printing. In some embodiments, the first bumps 212 may be formed by a mounting process and a reflow process, for example. At this stage. the circuit board structure CBS may be also called a semi-finished circuit substrate or a semi-finished circuit carrier in some examples.

Figure 1F:
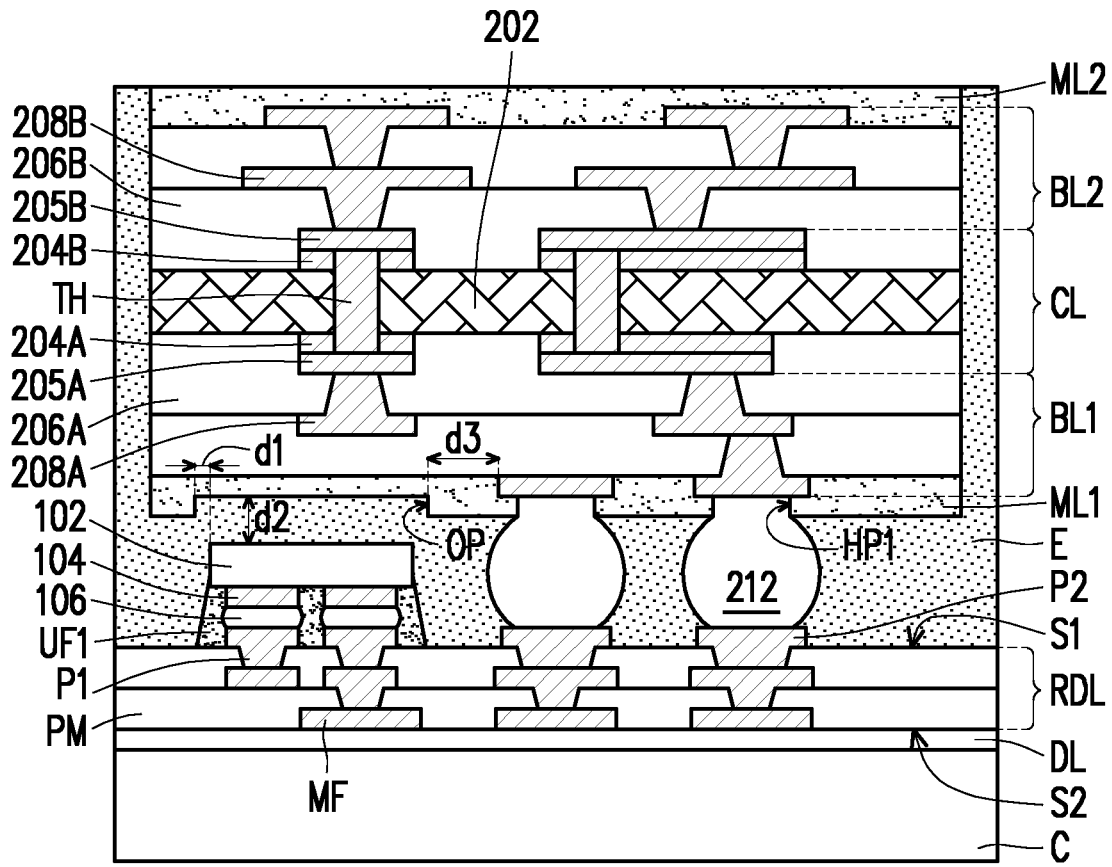

Referring to FIG. 1F, the circuit board structure CBS is turned over, such that the first mask layer ML1 of the circuit board structure CBS faces the first side S1 of the redistribution layer structure RDL. Specifically, the circuit board structure CBS is placed over the first semiconductor chip 100 with the opening pattern OP corresponding to the first semiconductor chip 100, and the circuit board structure CBS is bonded to the metal pads P2 through the first bumps 212.

Thereafter, an encapsulation layer E is formed to encapsulate or surround the sidewall of the circuit board structure CBS and fill the space between the circuit board structure CBS and each of the first semiconductor chip 100 and the redistribution layer structure RDL. In some embodiments, the encapsulation layer E includes a molding compound, a molding underfill, a resin or the like, such as epoxy. In some embodiments, the encapsulation layer E includes a polymer material such as polybenzoxazole (PBO), polyimide, benzocyclobutene (BCB), the like, or a combination thereof. In some embodiments, the encapsulation layer E is formed by a molding process. A molding material may be dispensed or injected from one side of the structure (e.g., the side close to the first semiconductor chip 100 or the side close to the outermost first bumps 212), and the molding material is then drawn by capillary action and therefore encapsulates the sidewall and top of the first semiconductor chip 100, completely fills the opening pattern OP of the first mask layer ML1 and surrounds the first bumps 212.

Figure 1G:
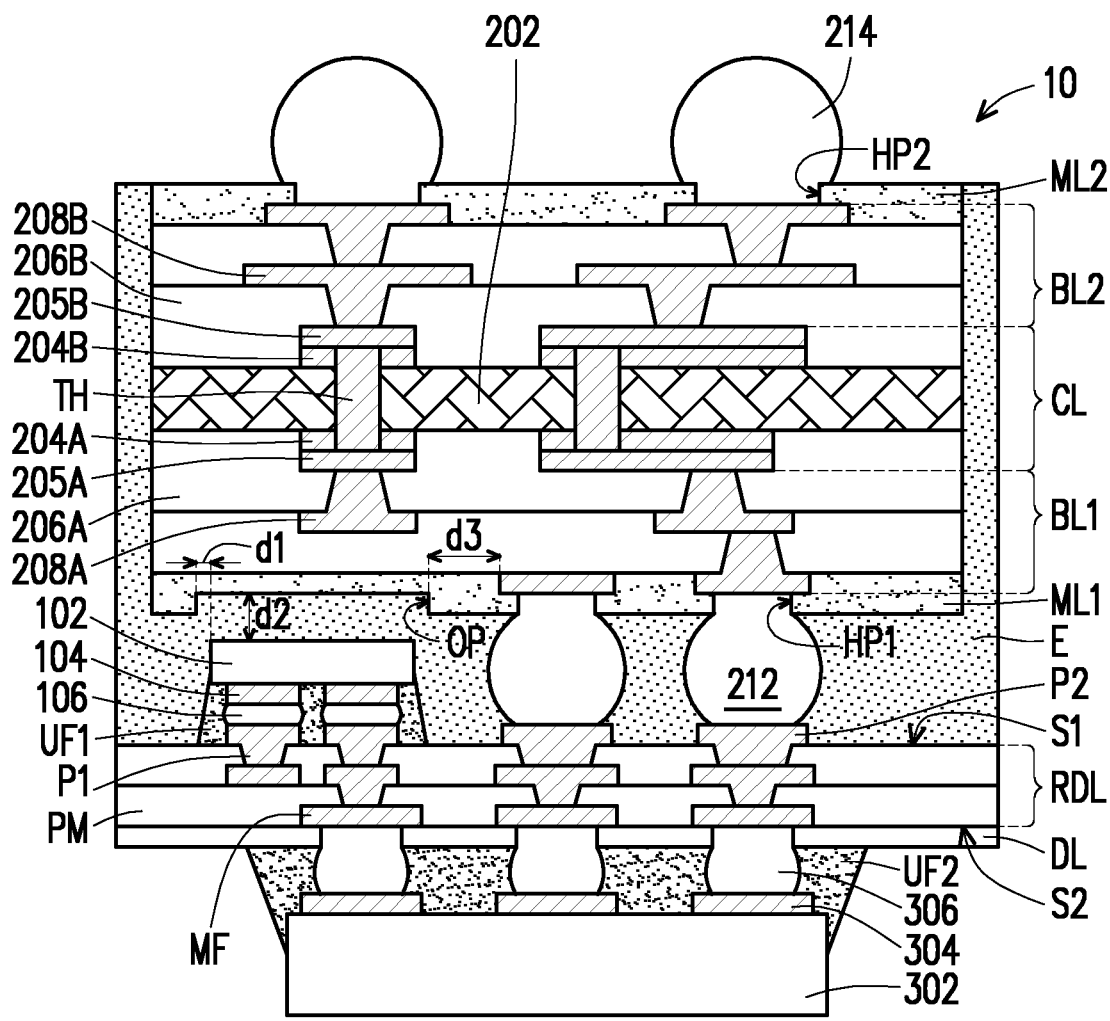

Referring to FIG. 1G, the carrier C is released from the overlying structure. In some embodiments, the debonding layer is decomposed under heat of light, and the carrier C is then released from the second side S2 of the redistribution layer structure RDL.

Thereafter, a second semiconductor chip 300 is provided and bonded to the second side S2 of the redistribution layer structure RDL. In some embodiments, the second semiconductor chip 300 includes an integrated active device. In some embodiments, the second semiconductor chip 300 has a semiconductor substrate 302, connection pads 304, and bumps 306. The semiconductor substrate 302 includes an elementary semiconductor such as silicon, germanium and/or a compound semiconductor such as silicon germanium, silicon carbide, gallium arsenic, indium arsenide, gallium nitride or indium phosphide. For example, the semiconductor substrate 302 is a silicon-on-insulator (SOI) substrate or a silicon substrate. In various embodiments, the semiconductor substrate 302 may take the form of a planar substrate, a substrate with multiple fins, nanowires, or other forms known to people having ordinary skill in the art. Depending on the requirements of design, the semiconductor substrate 302 may be a P-type substrate or an N-type substrate and may have doped regions therein. The integrated active device is disposed on and/or in the active area of the semiconductor substrate 302. The integrated active device includes a transistor, such as fin field effect transistor (Fin-FET), a gate all around FET (GAA-FET) or the like. The second semiconductor chip 300 is referred to a transistor-containing chip in some examples.

The connection pads 304 are formed over the semiconductor substrate 302 and electrically connected to the integrated active device of the second semiconductor chip 300. In some embodiments, the connection pads 304 include copper-containing pillars, and are formed by an electroplating process. In some embodiments, the connection pads 304 are formed as the top portions of the second semiconductor chip 300. The bumps 306 are formed on the connection pads 304. In some embodiments, the bumps 106 include solder bumps, and are formed with a ball drop process or an electroplating process. The bumps 306 are referred to as micro-bumps in some examples. The connection pads 304 and/or the bumps 306 constitute parts of the connectors (e.g., front-side connectors) of the second semiconductor chip 300. In some embodiments, the second semiconductor chip 300 is bonded to the redistribution layer structure RDL through the bumps 306 with the front side thereof facing the redistribution layer structure RDL. In some embodiments, the bumps 306 of the second semiconductor chip 300 penetrate through the dielectric layer DL and land on the lowermost metal feature MF of the redistribution layer structure RDL.

Thereafter, an underfill layer UF2 is formed to fill the space between the redistribution layer structure RDL and the second semiconductor chip 300. In some embodiments, the underfill layer UF2 is formed to surround the connection pads 304 and the bumps 306. In some embodiments, the underfill layer UF2 includes a molding compound such as epoxy, and is formed using a dispensing process, an injecting process, and/or a spraying process.

Still referring to FIG. 1G, second bumps 214 are formed in second hole patterns HP2 of the second mask layer ML2 over the second build-up layer BL2. In some embodiments, the second mask layer ML2 is patterned to have the second hole patterns HP2 at this stage for ball mount. However, the disclosure is not limited thereto. In other embodiments, the second mask layer ML2 is patterned to have second hole patterns HP2 at the stage of FIG. 1E when the circuit board structure CBS is first provided. In some embodiments, the second bumps 214 may be solder bumps, and/or may include metal pillars (e.g., copper pillars), solder caps formed on metal pillars, and/or the like. When solder is used, the solder may include either eutectic solder or non-eutectic solder. The solder may include lead or be lead-free, and may include Sn—Ag, Sn—Cu, Sn—Ag—Cu, or the like. The second bumps 214 may be formed by a suitable process such as an evaporation, an electroplating, a ball drop, or a screen printing. In some embodiments, the second bumps 214 may be formed by a mounting process and a reflow process, for example. At this stage, the circuit board structure CBS may be also called a finished circuit substrate or a finished circuit carrier in some examples.

In some embodiments, the size of the second bumps 214 of the circuit board structure CBS is different from (e.g., greater than) the size of the first bumps 212 or the circuit board structure CBS. In some embodiments, the size of the first bumps 212 is different from (e.g., greater than) the size of the bumps 306 of the second semiconductor chip 300. In some embodiments, the size of the bumps 306 of the second semiconductor chip 300 is different from (e.g., greater than) the size of the bumps 106 of the first semiconductor chip 100.

At this point, a semiconductor package 10 of some embodiments is thus fabricated. In the disclosure, the opening pattern OP of the first mask layer ML1 is configured to improve the molding performance. The relationship between the opening pattern OP of the first mask layer ML1 and the adjacent element is described below with reference to the cross-sectional view of FIG. 1G and the top-view of FIG. 3.

Figure 3:
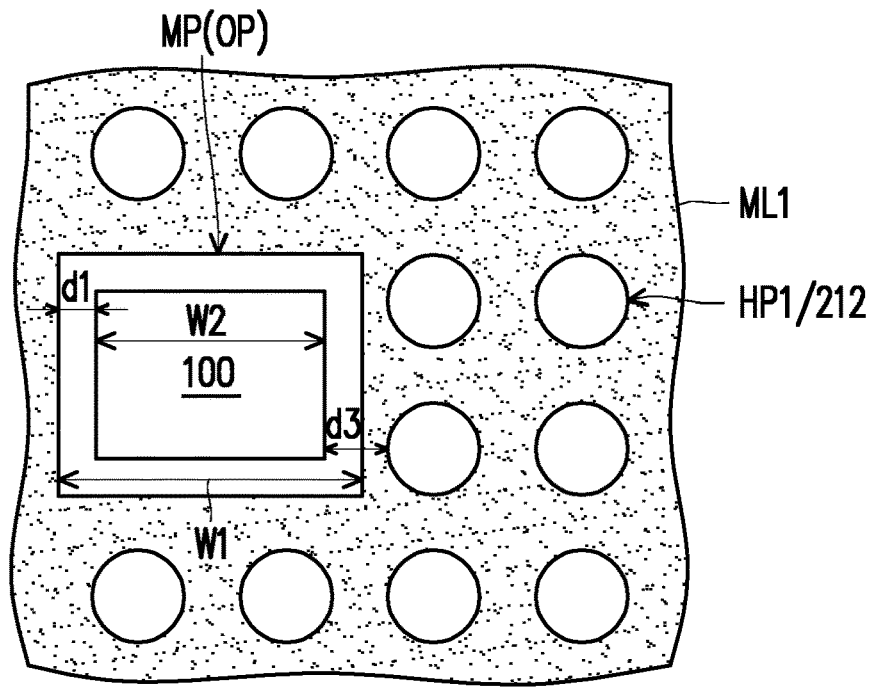
FIG. 3 to FIG. 6 are simplified top views of various semiconductor packages in accordance with some embodiments.

FIG. 3 is a schematic top view of a semiconductor package in accordance with some embodiments. For simplicity and clarity of illustration, only few elements are shown in the top view of FIG. 3, and these elements are not necessarily in the same plane.

In some embodiments, the horizontal distance from an edge or sidewall of the first semiconductor chip 100 to an edge or sidewall of the opening pattern OP of the first mask layer ML1 is marked as "d1". In some embodiments, the horizontal separation distance d1 is about 50 um or more. Such horizontal separation distance d1 allows more process tolerance when the opening pattern OP of the first mask layer ML1 is defined.

In some embodiments, the vertical distance from a surface (e.g., substrate surface) of the first semiconductor chip 100 to a surface (e.g., bottom surface) of the opening pattern OP of the first mask layer ML1 is marked as "d2". In some embodiments, the vertical separation distance d2 is about 65 um or more. Such vertical separation distance d2 allows more space for subsequently formed encapsulation layer E to flow through.

In some embodiments, the horizontal distance from an edge or sidewall of the closest conductive pattern 208A to an edge or sidewall of the opening pattern OP of the first mask layer ML1 is marked as "d3". In some embodiments, the horizontal separation distance d3 is about 150 um or more. Such horizontal separation distance d1 allows more process tolerance when the opening pattern OP of the first mask layer ML1 is defined.

In the disclosure, the opening pattern OP of the first mask layer ML1 is configured to increase the process tolerance, allow more space for the encapsulation material to flow through, and therefore improve the molding performance. The distances d1, d2 and d3 are required to be higher than the set values so as to achieve the mentioned effects.

Figure 2:
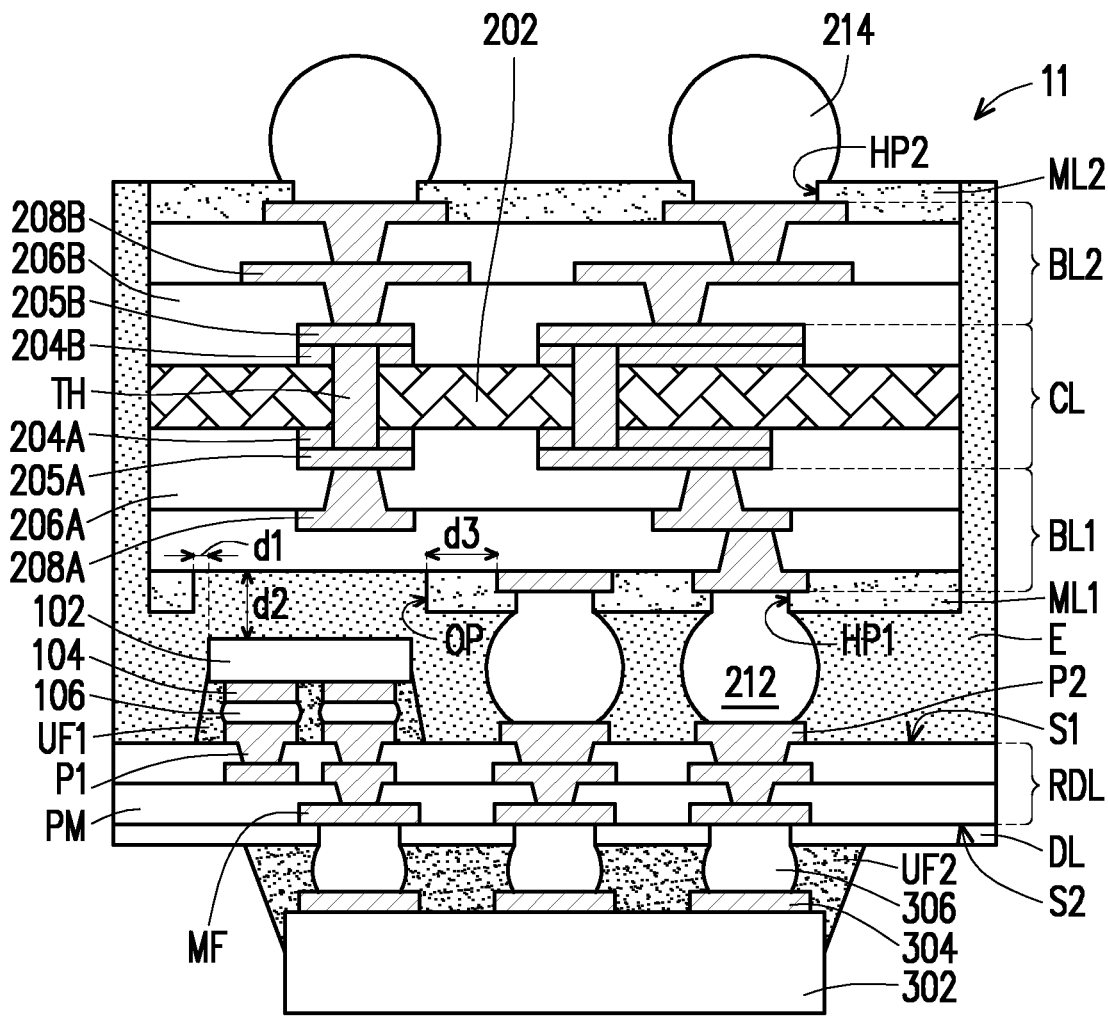
FIG. 2 is a cross-sectional view of a semiconductor package in accordance with some embodiments.

The above embodiments of FIG. 1G in which the opening pattern OP of the first mask layer ML1 does not penetrate through the first mask layer ML1 are provided for illustration purposes, and are not construed as limiting the present disclosure. In other embodiments, the opening pattern OP of the first mask layer ML1 penetrates through the first mask layer ML1 and exposes the outermost dielectric layer 206A, as shown in the semiconductor package 11 of FIG. 2. In some embodiments, the opening pattern OP of the first mask layer ML1 in FIG. 2 is defined by a full-tone mask or reticle.

In the embodiment of FIG. 3, the opening pattern OP of the first mask layer ML1 merely includes a main pattern MP, since the first hole patterns HP1 aside the main pattern MP are distributed uniformly. However, the disclosure is not limited thereto. In other embodiments, the first hole patterns HP1 aside the main pattern MP of the first mask layer ML1 are not distributed uniformly. Accordingly, the opening pattern OP of the first mask layer ML1 may be designed differently to balance the pattern density of the first mask layer ML1, as shown in FIG. 4 to FIG. 6.

Figure 4:
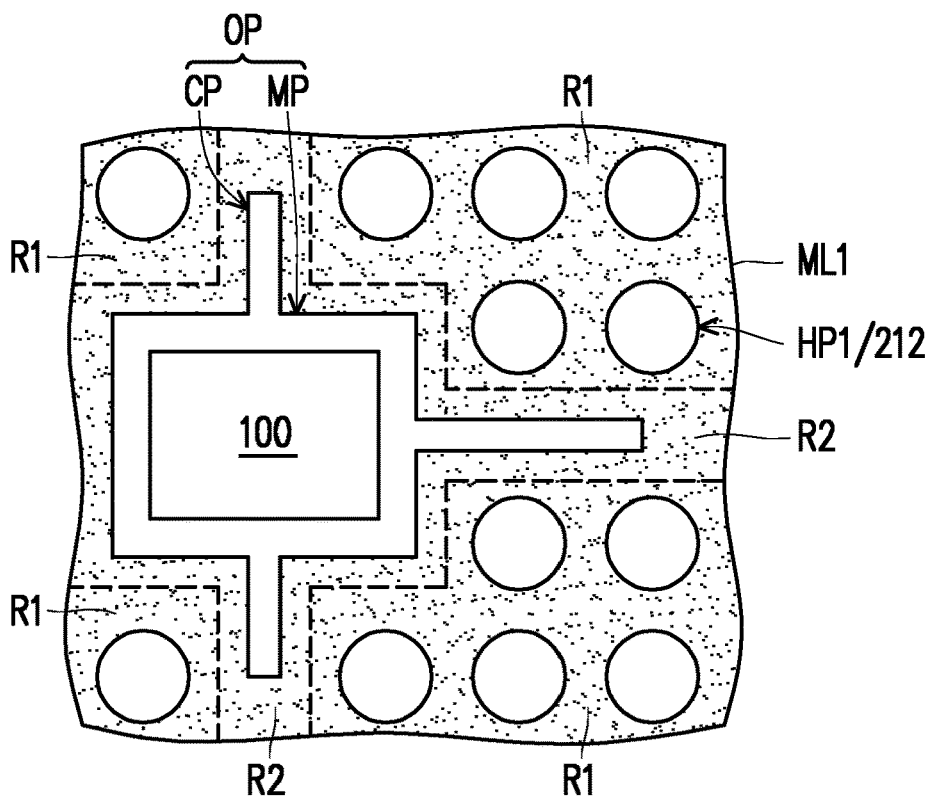
Figure 5:
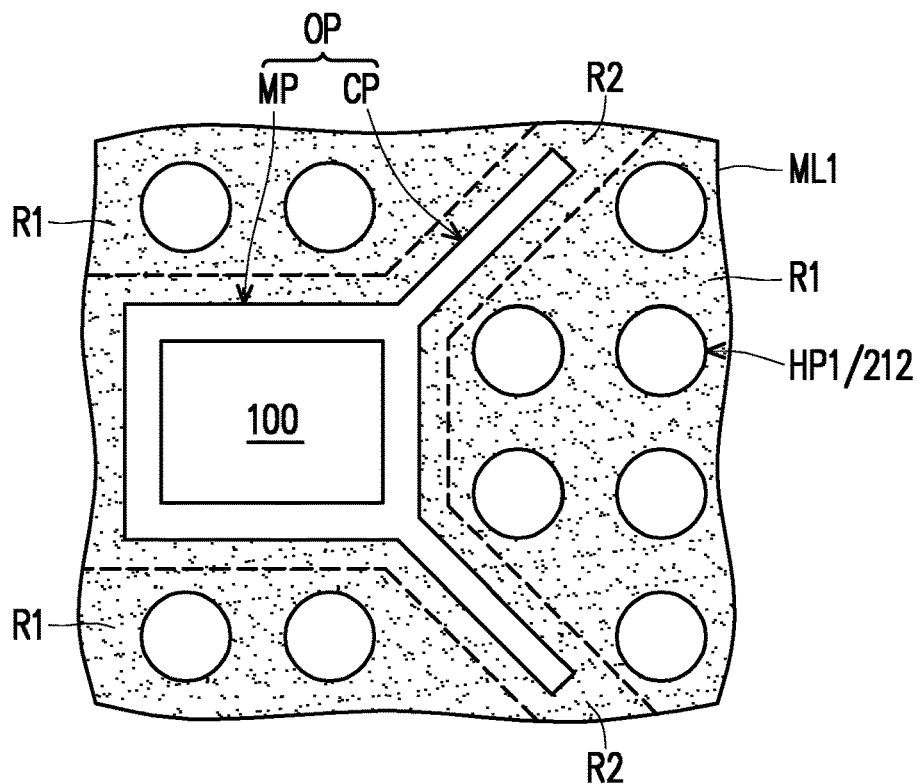
Figure 6:
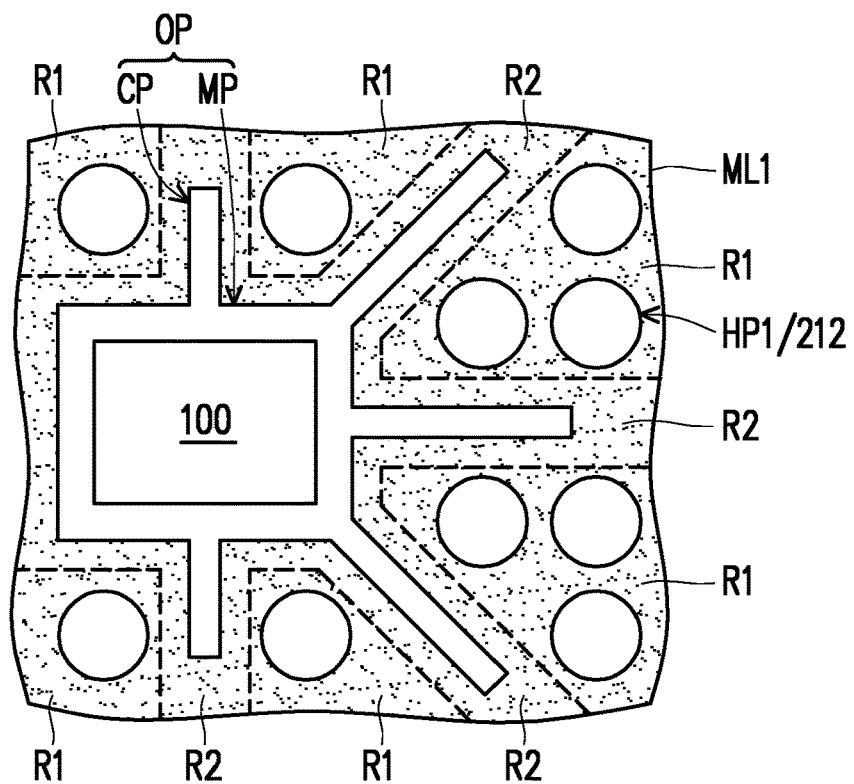

FIG. 4 to FIG. 6 are simplified top views of various semiconductor packages in accordance with some embodiments. For simplicity and clarity of illustration, only few elements are shown in the top views of FIG. 4 to FIG. 6, and these elements are not necessarily in the same plane.

As shown in FIG. 4 to FIG. 6, the opening pattern OP of the first mask layer ML1 includes a main pattern MP and at least one channel pattern CP extending outwardly from the main pattern MP. Such channel patterns CP or branch openings are configured to balance the pattern density of the first mask layer ML1 and therefore improve the molding uniformity. Specifically, the first hole patterns HP1 aside the main pattern MP of the first mask layer ML1 are not distributed uniformly. In some embodiments, the first mask layer ML1 includes a pattern-dense region R1 and a pattern-sparse region R2 aside the pattern-dense region R1. The pattern-dense region R1 is a region including most of, or all of the patterns of the first mask layer ML1, while the pattern-sparse region R2 is a region including few of, or none of the patterns of the first mask layer ML1. In some embodiments, all of the first hole patterns HP1 are located in the pattern-dense region R1, and none of the first hole patterns HP1 is located in the pattern-sparse region R2.

In the embodiment of FIG. 4, each channel pattern CP extends from a middle of the corresponding sidewall of the main pattern MP. In the embodiment of FIG. 5, each channel pattern CP extends from a corner of the main pattern MP. In the embodiment of FIG. 6, some channel patterns CP extend from middles of the corresponding sidewalls of the main pattern MP, and some channel patterns CP extend from corners of the main pattern MP.

The shapes and depths of the opening patterns OP (including main and channel patterns) of the first mask layers ML1 are not limited to the figures provided in the disclosure. Specifically, the shape and depth of the opening pattern of the first mask layer are contemplated as falling within the spirit and scope of the present disclosure, as long as such opening pattern is beneficial to improve the molding uniformity.

Figure 7:
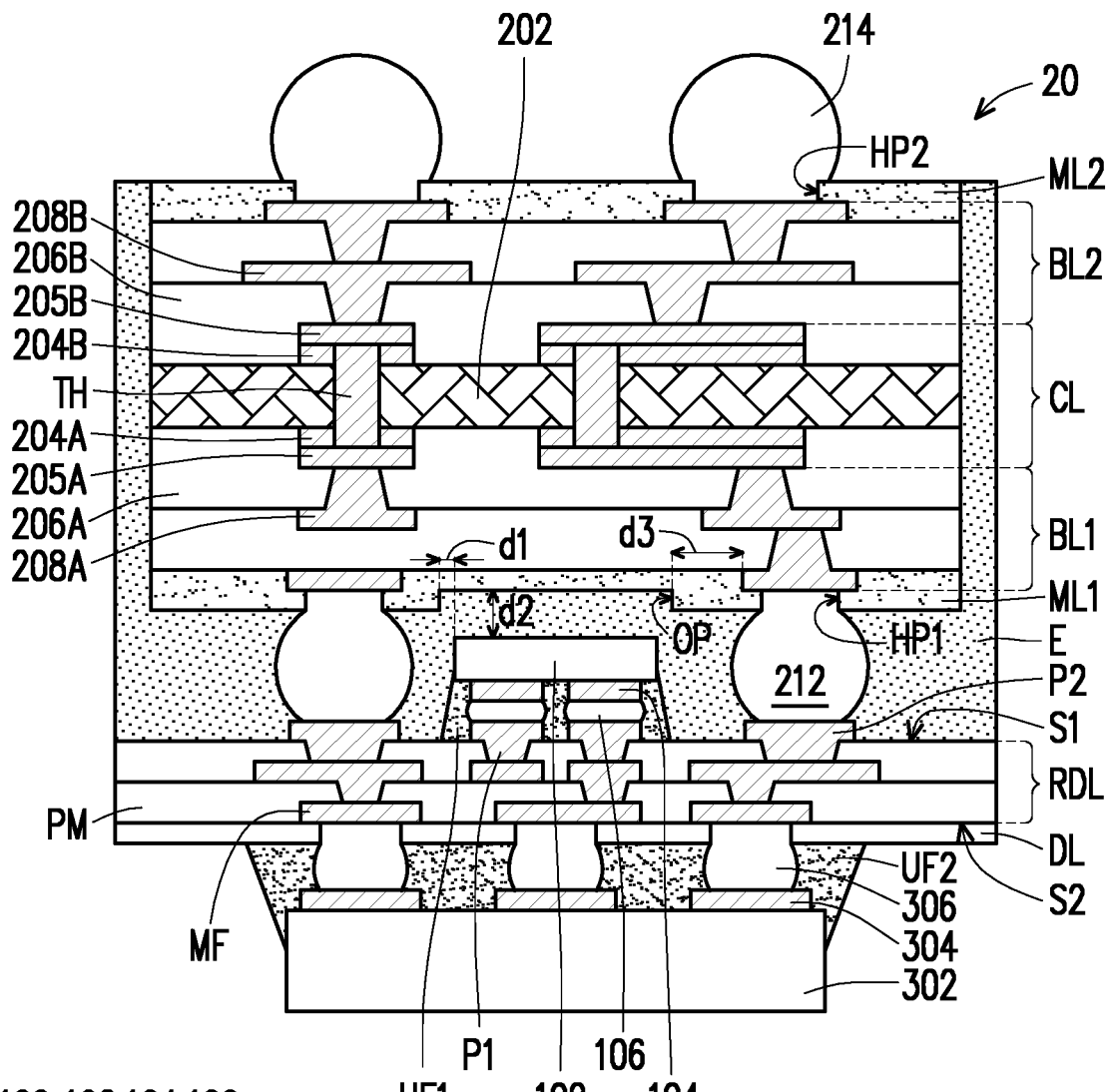
FIG. 7 to FIG. 8 are schematic cross-sectional views of semiconductor packages in accordance with other embodiments.
Figure 8:
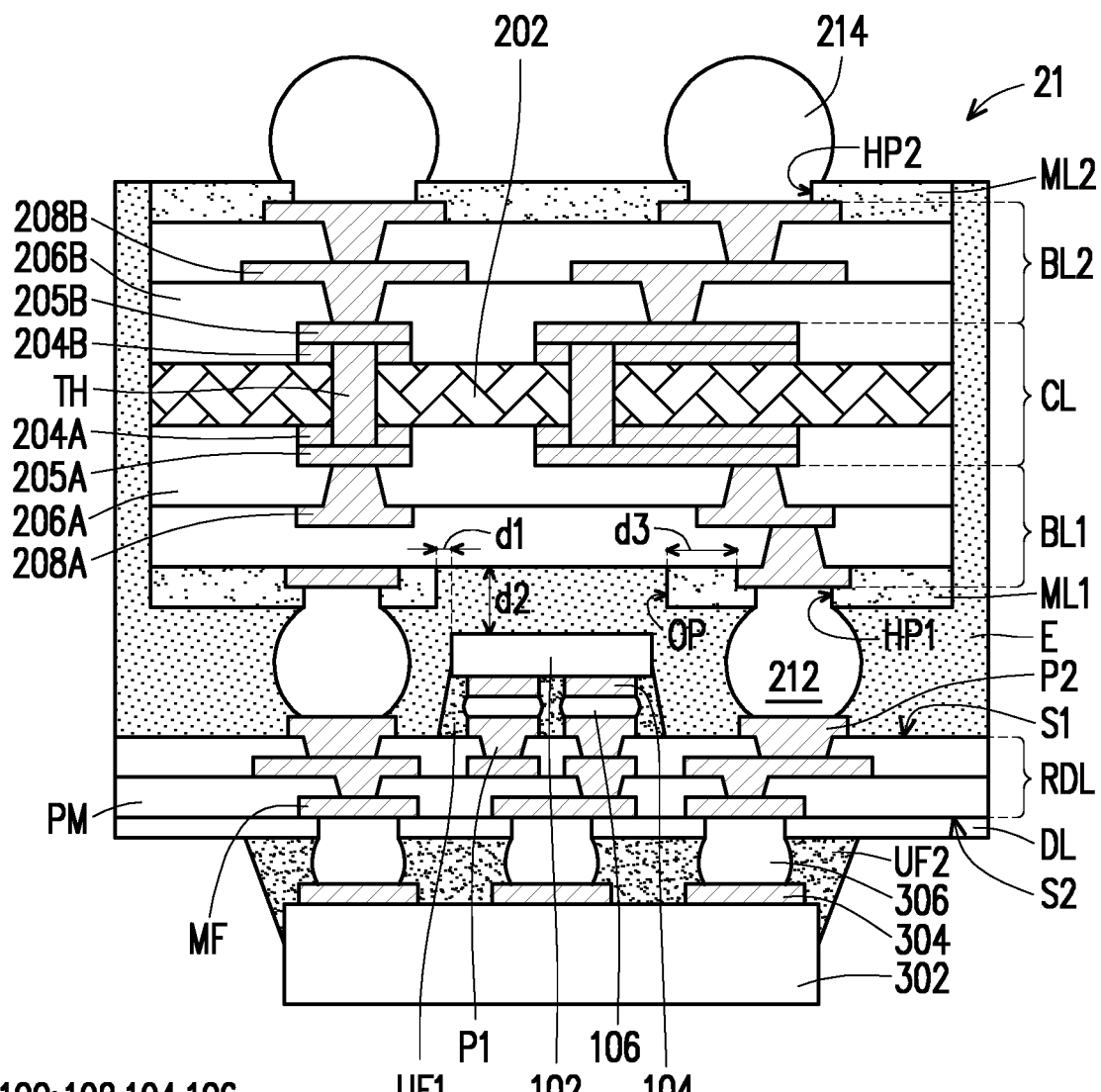

FIG. 7 to FIG. 8 are schematic cross-sectional views of semiconductor packages in accordance with other embodiments. FIG. 9 to FIG. 12 are simplified top views of various semiconductor packages in accordance with other embodiments.

The semiconductor packages 20 and 21 of FIG. 7 to FIG. 8 are similar to the semiconductor packages 10 and 11 of FIG. 1G to FIG. 2, and the difference between them lies in the relative positions of the first semiconductor chip 100 and the first bumps 212.

In the semiconductor packages 10 and 11 of FIG. 1G to FIG. 2, the first semiconductor chip 100 is at one side of the package region, while the first bumps 212 are at another side of the package region. Specifically, in the semiconductor packages 10 and 11 of FIG. 1G to FIG. 2, the first bumps 212 surround three sides of the first semiconductor chip 100, as shown in FIG. 3 to FIG. 6.

In the semiconductor packages 20 and 21 of FIG. 7 to FIG. 8, the first semiconductor chip 100 is at a center area of the package region, while the first bumps 212 are at a periphery area of the package region. Specifically, in the semiconductor packages 20 and 21 of FIG. 7 to FIG. 8, the first bumps 212 surround four sides of the first semiconductor chip 100, as shown in FIG. 9 to FIG. 12.

The semiconductor packages of the disclosure and their modifications will be described below with reference to FIG. 1G to FIG. 12.

In some embodiments, a semiconductor package 10/11/20/21 includes a redistribution layer structure RDL, a first semiconductor chip 100, a circuit board structure CBS and an encapsulation layer E. The redistribution layer structure RDL has a first side S1 and a second side S2 opposite to the first side S1. The first semiconductor chip 100 is electrically connected to the first side S1 of the redistribution layer structure RDL. In some embodiments, the first semiconductor chip 100 is a passive integrated device. The circuit board structure CBS is electrically connected to the first side S1 of the redistribution layer structure RDL. The circuit board structure CBS includes a first mask layer ML1 having an opening pattern OP that corresponds to first semiconductor chip 100. The encapsulation layer E laterally encapsulates the circuit board structure CBS and fills in a space between the semiconductor chip 100 and the opening pattern OP of the first mask layer ML1 of the circuit board structure CBS.

Figure 9:
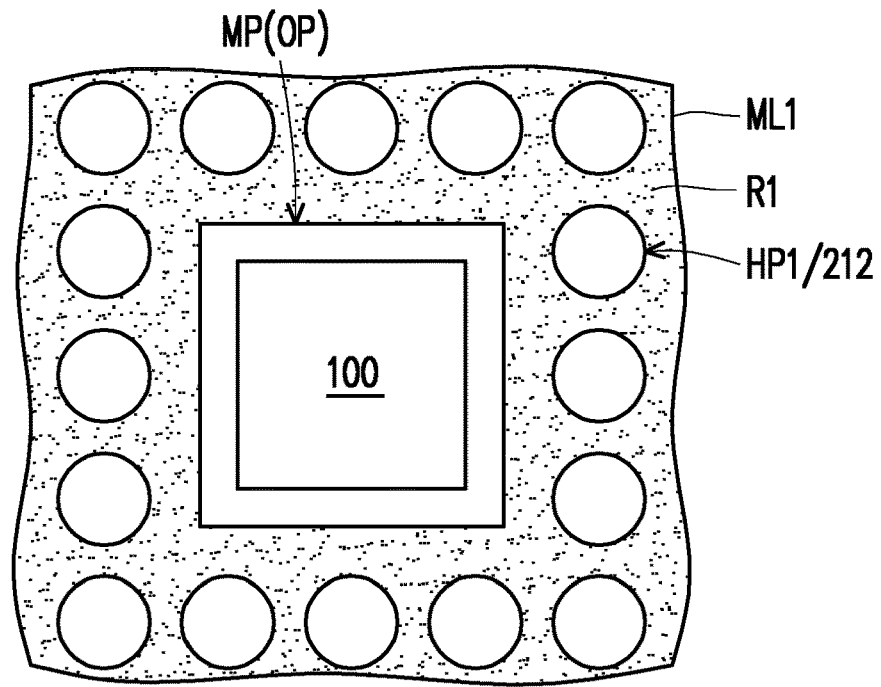
FIG. 9 to FIG. 12 are simplified top views of various semiconductor packages in accordance with other embodiments.
Figure 10:
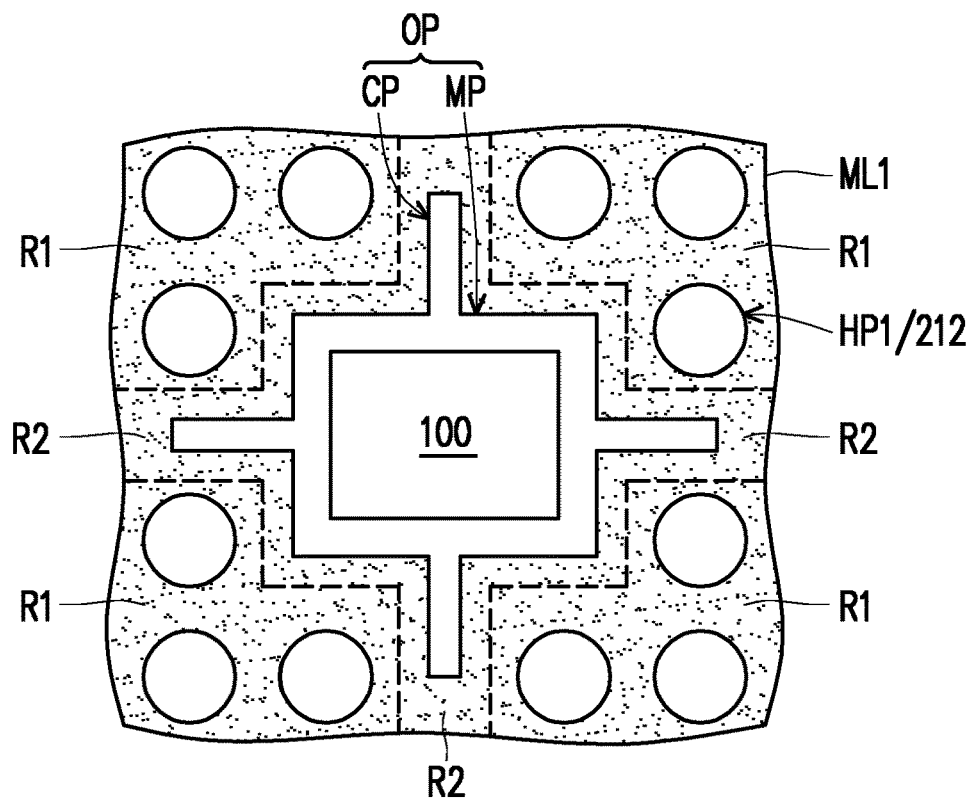
Figure 11:
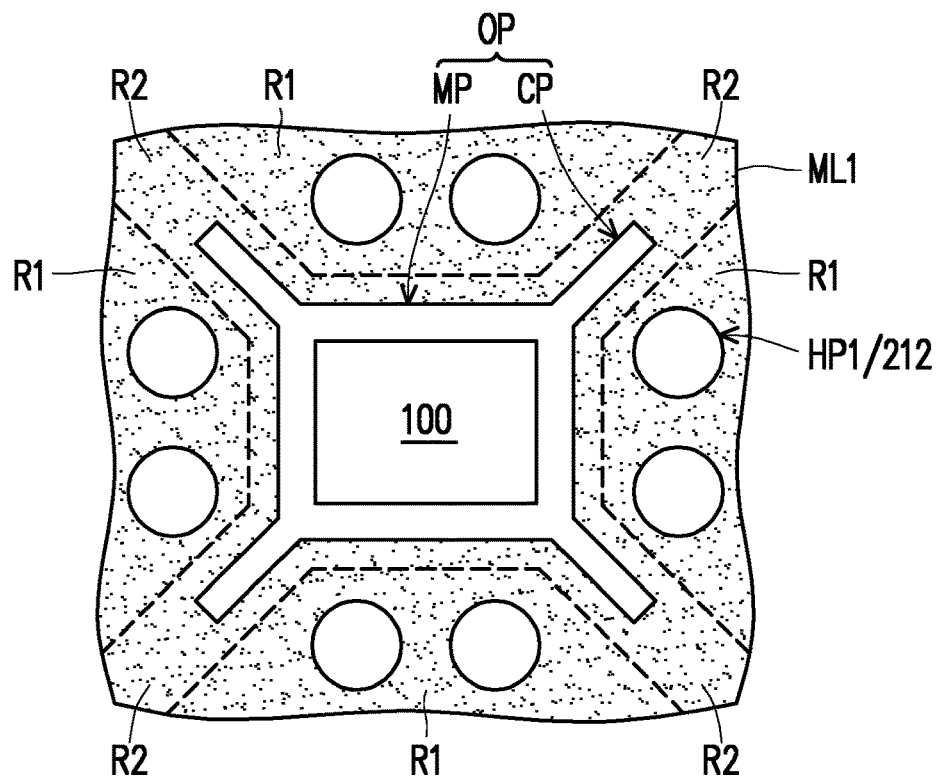
Figure 12:
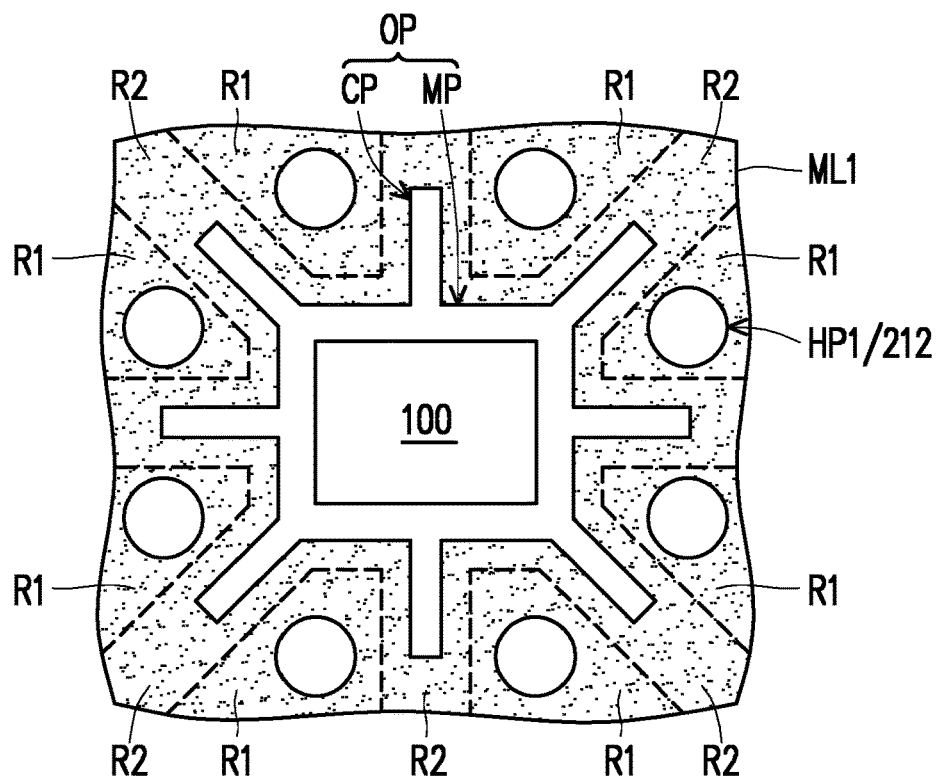

In some embodiments, the opening pattern OP of the first mask layer ML1 includes a main pattern, and a dimension (e.g., width W1) of the main pattern MP is greater than a dimension (e.g., width W2) of the first semiconductor chip 100, as shown in FIG. 3 and FIG. 9. The dimension can be a length or a top-view area.

In some embodiments, the opening pattern OP of the first mask layer ML further includes a plurality of channel patterns CP, and each of the plurality of channel patterns CP extends outwardly from the main pattern MP, as shown in FIG. 4 to FIG. 6 and FIG. 10 to FIG. 12. In some embodiments, each of the plurality of channel patterns CP is located in a pattern-sparse region R2 of the first mask layer ML1.

In some embodiments, the circuit board structure CBS is bonded to the redistribution layer structure RDL through a plurality of first bumps 212. In some embodiments, the first mask layer ML1 surrounds portions of the first bumps 212.

In some embodiments, the semiconductor package further includes a second semiconductor chip 300 electrically connected to second side S2 of the redistribution layer structure RDL. In some embodiments, the second semiconductor chip is an active integrated device.

In some embodiments, a semiconductor package 10/11/20/21 includes a circuit board structure CBS and a first semiconductor chip 100. The circuit board structure CBS is disposed over a first side S1 of the redistribution layer structure RDL and includes a first mask layer ML1 that faces the first side S1 of the redistribution layer structure RDL1. The first semiconductor chip 100 is disposed between the first mask layer ML1 of the circuit board structure CBS and the redistribution layer structure RDL. In some embodiments, from a top view, a projection area of an opening pattern OP of the first mask layer ML1 on the first side S1 of the redistribution layer structure RDL is greater than a projection area of the first semiconductor chip 100 on the first side S1 of the redistribution layer structure RDL.

In some embodiments, the circuit board structure CBS further includes a plurality of first bumps 212 that penetrate through the first mask layer ML1 and are bonded to the first side S1 of the redistribution layer structure RDL.

In some embodiments, the opening pattern OP of the first mask layer ML1 includes a main pattern MP corresponding to the first semiconductor chip 100 and a plurality of channel patterns CP extending outwardly from the main pattern MP.

In some embodiments, the circuit board structure CBS further includes a core layer CL and a first build-up layer BL1 and a second build-up layer BL2 disposed on opposite sides of the core layer CL, the first mask layer ML1 is disposed on the first build-up layer BL1, and the opening pattern OP of the first mask layer ML1 does not expose the first build-up layer BL1, as shown in FIG. 1G and FIG. 7.

In some embodiments, the circuit board structure CBS further includes a core layer CL and a first build-up layer BL1 and a second build-up layer BL2 disposed on opposite sides of the core layer CL, the first mask layer ML1 is disposed on the first build-up layer BL1, and the opening pattern OP of the first mask layer ML1 exposes the first build-up layer BL1, as shown in FIG. 2 and FIG. 8.

In some embodiments, a horizontal distance d1 from an edge of opening pattern OP of the first mask layer ML1 to an edge of the first semiconductor chip 100 is about 50 nm or more. In some embodiments, a vertical distance d2 from a surface of the opening pattern OP of the first mask layer ML1 to a surface of the first semiconductor chip 100 is about 65 nm or more.

In some embodiments, the semiconductor package 10/11/20/21 further includes an encapsulation layer E disposed over the first side S1 of the redistribution layer structure RDL and aside the first semiconductor chip 100 and the circuit board structure CBS.

Figure 13:
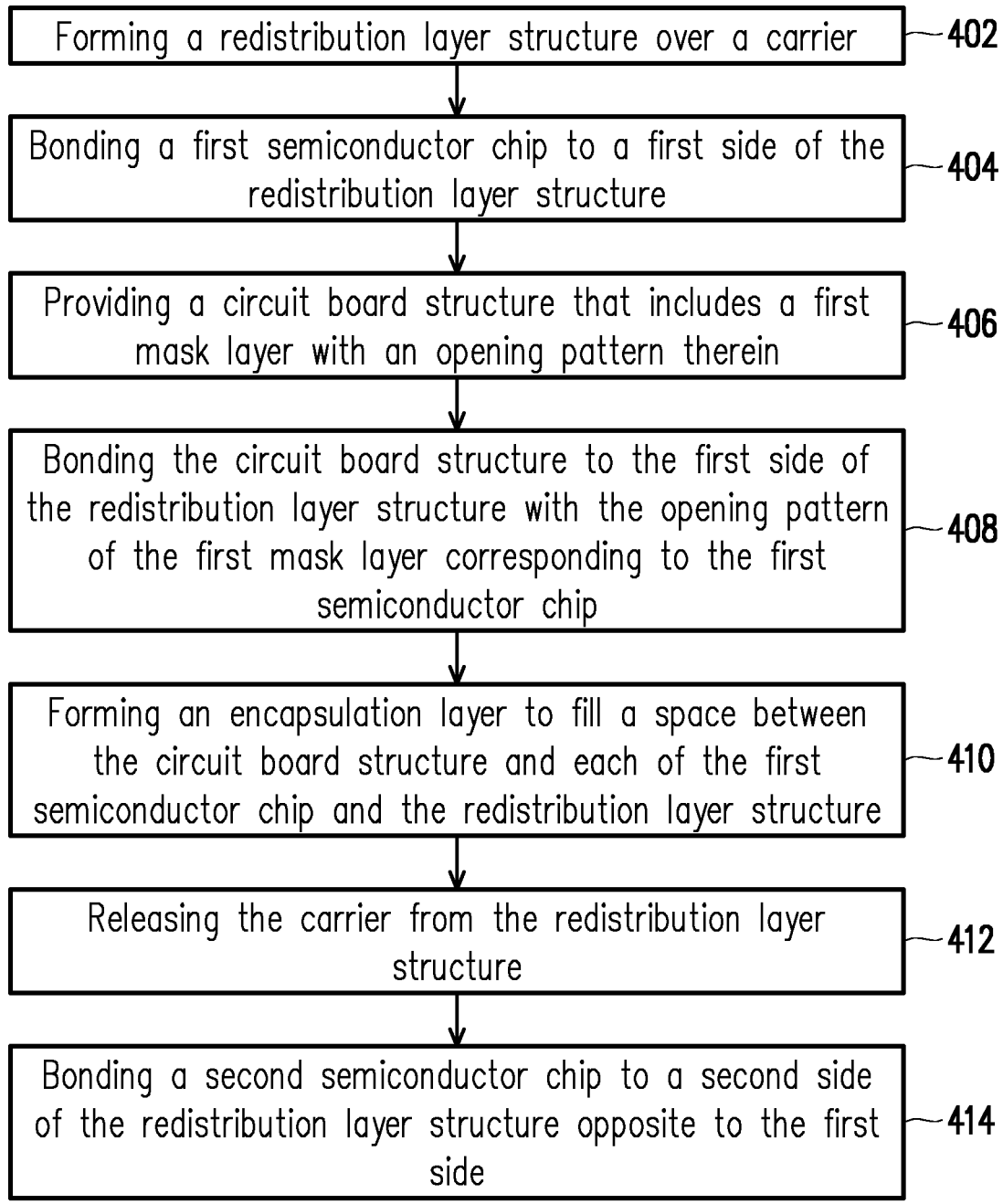
FIG. 13 illustrates a method of forming a semiconductor package in accordance with some embodiments.

FIG. 13 illustrates a method of forming a semiconductor package in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 402, a redistribution layer structure is formed over a carrier. FIG. 1A to FIG. 1B illustrate cross-sectional views corresponding to some embodiments of act 402.

At act 404, a first semiconductor chip is bonded to a first side of the redistribution layer structure. FIG. 1C to FIG. 1D illustrate cross-sectional views corresponding to some embodiments of act 404.

At act 406, a circuit board structure is provided, and the circuit board structure includes a first mask layer with an opening pattern therein. FIG. 1E illustrates a cross-sectional view corresponding to some embodiments of act 406.

At act 408, the circuit board structure is bonded to the first side of the redistribution layer structure with the opening pattern of the first mask layer corresponding to the first semiconductor chip. FIG. 1F illustrates a cross-sectional view corresponding to some embodiments of act 408.

At act 410, an encapsulation layer is formed to fill a space between the circuit board structure and each of the first semiconductor chip and the redistribution layer structure. FIG. 1F illustrates a cross-sectional view corresponding to some embodiments of act 410.

At act 412, the carrier is released from the redistribution layer structure. FIG. 1G illustrates a cross-sectional view corresponding to some embodiments of act 412.

At act 414, a second semiconductor chip is bonded to a second side of the redistribution layer structure opposite to the first side. FIG. 1G illustrates a cross-sectional view corresponding to some embodiments of act 414.

The above embodiments in which the first semiconductor chip is an integrated passive device while the second semiconductor chip is an integrated active device are provided for illustration purposes, and are not construed as limiting the present disclosure. In other embodiments, each of the first semiconductor chip and the second semiconductor chip may be an integrated active device or an integrated active device upon the design requirements.

Many variations of the above examples are contemplated by the present disclosure. It is understood that different embodiments may have different advantages, and that no particular advantage is necessarily required of all embodiments.

In accordance with some embodiments of the present disclosure, a semiconductor package includes a redistribution layer structure, a first semiconductor chip, a circuit board structure and an encapsulation layer. The redistribution layer structure has a first side and a second side opposite to the first side. The first semiconductor chip is electrically connected to the first side of the redistribution layer structure. The circuit board structure is electrically connected to the first side of the redistribution layer structure, and the circuit board structure includes a first mask layer having an opening pattern that corresponds to first semiconductor chip. The encapsulation layer laterally encapsulates the circuit board structure and fills in a space between the semiconductor chip and the opening pattern of the first mask layer of the circuit board structure.

In accordance with alternative embodiments of the present disclosure, a semiconductor package includes a circuit board structure and a first semiconductor chip. The circuit board structure is disposed over a first side of the redistribution layer structure and includes a first mask layer facing the first side of the redistribution layer structure. The first semiconductor chip is disposed between the first mask layer of the circuit board structure and the redistribution layer structure. In some embodiments, a projection area of an opening pattern of the first mask layer on the first side of the redistribution layer structure is greater than a projection area of the first semiconductor chip on the first side of the redistribution layer structure.

In accordance with yet alternative embodiments of the present disclosure, a method of forming a circuit board structure includes the following operations. A redistribution layer structure is formed over a carrier. A first semiconductor chip is bonded to a first side of the redistribution layer structure. A circuit board structure is provided, and the circuit board structure includes a first mask layer with an opening pattern therein. The circuit board structure is bonded to the first side of the redistribution layer structure with the opening pattern of the first mask layer corresponding to the first semiconductor chip. An encapsulation layer is formed to fill a space between the circuit board structure and each of the first semiconductor chip and the redistribution layer structure. The carrier is released from the redistribution layer structure. A second semiconductor chip is bonded to a second side of the redistribution layer structure opposite to the first side.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
a first semiconductor chip;
a circuit board structure disposed over the first semiconductor chip and comprising a first mask layer having an opening pattern corresponding to the first semiconductor chip; and
an encapsulation layer, filling in a vertical space between the first semiconductor chip and the opening pattern of the first mask layer of the circuit board structure,
wherein from a top view, the opening pattern of the first mask layer comprises a main pattern corresponding to the first semiconductor chip and a plurality of channel patterns extending outwardly from the main pattern, and the main pattern is connected to the plurality of channel patterns.

2. The semiconductor package of claim 1, further comprising a redistribution layer structure disposed below and electrically connected to the first semiconductor chip.

3. The semiconductor package of claim 2, further comprising a second semiconductor chip disposed below and electrically connected to the redistribution layer structure.

4. The semiconductor package of claim 3, wherein the second semiconductor chip is an active integrated device.

5. The semiconductor package of claim 2, wherein the circuit board structure further comprises a plurality of first bumps penetrating through the first mask layer and bonded to the redistribution layer structure, and wherein from the top view, the plurality of channel patterns are separated from the plurality of first bumps.

6. The semiconductor package of claim 1, wherein the encapsulation layer further encapsulates a sidewall of the circuit board structure.

7. The semiconductor package of claim 1, wherein a width of the main pattern is greater than a width of the first semiconductor chip.

8. The semiconductor package of claim 1, wherein each of the plurality of channel patterns is located in a pattern-sparse region of the first mask layer.

9. The semiconductor package of claim 1, wherein the first semiconductor chip is a passive integrated device.

10. A semiconductor package, comprising:
a circuit board structure, disposed over a first side of the redistribution layer structure and comprising a first mask layer facing the first side of the redistribution layer structure; and
a first semiconductor chip, disposed between the first mask layer of the circuit board structure and the redistribution layer structure,
wherein from a top view, an opening pattern of the mask layer comprises a main pattern corresponding to the first semiconductor chip and a plurality of channel patterns extending outwardly from the main pattern, and the main pattern is connected to the plurality of channel patterns.

11. The semiconductor package of claim 10, wherein a projection area of the main pattern of the first mask layer on the first side of the redistribution layer structure is greater than a projection area of the first semiconductor chip on the first side of the redistribution layer structure.

12. The semiconductor package of claim 10, wherein the circuit board structure further comprises a plurality of first bumps penetrating through the first mask layer and bonded to the first side of the redistribution layer structure.

13. The semiconductor package of claim 10, wherein each of the plurality of channel patterns is located in a pattern-sparse region of the first mask layer.

14. The semiconductor package of claim 10, wherein the circuit board structure further comprises a core layer and a first build-up layer and a second build-up layer disposed on opposite sides of the core layer, the first mask layer is disposed on the first build-up layer, and the opening pattern of the first mask layer does not expose the first build-up layer.

15. The semiconductor package of claim 10, wherein the circuit board structure further comprises a core layer and a first build-up layer and a second build-up layer disposed on opposite sides of the core layer, the first mask layer is disposed on the first build-up layer, and the opening pattern of the first mask layer exposes the first build-up layer.

16. The semiconductor package of claim 10, wherein a vertical distance from a surface of the opening pattern of the first mask layer to a surface of the first semiconductor chip is about 65 nm or more.

17. The semiconductor package of claim 10, wherein a horizontal distance from an edge of opening pattern of the first mask layer to an edge of the first semiconductor chip is about 50 nm or more.

18. The semiconductor package of claim 10, further comprising an encapsulation layer disposed over the first side of the redistribution layer structure and aside the first semiconductor chip and the circuit board structure.

19. A method of forming a semiconductor package, comprising:
providing a first semiconductor chip;
providing a circuit board structure over the first semiconductor chip, wherein the circuit board structure comprises a first mask layer with an opening pattern corresponding to the first semiconductor chip; and
forming an encapsulation layer to fill in a vertical space between the first semiconductor chip and the opening pattern of the first mask layer of the circuit board structure,
wherein from a top view, the opening pattern of the first mask layer comprises a main pattern corresponding to the first semiconductor chip and a plurality of channel patterns extending outwardly from the main pattern, and the main pattern is connected to the plurality of channel patterns.

20. The method of claim 19, wherein the first semiconductor chip is formed on a first side of a redistribution layer structure, a second semiconductor chip is further formed on a second side of the redistribution layer structure opposite to the first side, and a width of the second semiconductor chip is different from a width of the first semiconductor chip.

* * * * *